United States Patent [19]

Miller

[11] Patent Number: 4,800,293

[45] Date of Patent: Jan. 24, 1989

[54] INFRASONIC SWITCH

[76] Inventor: Robert E. Miller, 1301 Rose Island Rd., Prospect, Ky. 40059

[21] Appl. No.: 38,945

[22] Filed: Apr. 16, 1987

[51] Int. Cl.$^4$ ........................................... H01H 35/00
[52] U.S. Cl. .................................... 307/117; 307/116; 307/140; 340/566; 367/94
[58] Field of Search ............... 307/112, 113, 114, 115, 307/116, 117, 118, 141, 132 E, 132 R; 200/61.62; 340/554, 557, 565, 566, 552, 573, 572, 544, 550; 315/149, 134, 150, 151, 152, 153, 154, 155, 156, 157, 158, 159; 367/93, 94

[56] References Cited

U.S. PATENT DOCUMENTS

| | | | |
|---|---|---|---|
| 3,440,347 | 4/1969 | Spencer et al. | 307/140 |
| 3,558,902 | 1/1971 | Casey | 307/140 |
| 3,590,271 | 6/1971 | Peters | 307/140 |
| 3,922,663 | 11/1975 | Lubke et al. | 307/117 X |
| 4,101,886 | 7/1978 | Grimes et al. | 307/140 X |
| 4,263,665 | 4/1981 | Watts | 367/94 |
| 4,344,071 | 8/1982 | Allen | 340/566 |
| 4,349,747 | 4/1982 | Hasegawa | 307/117 |
| 4,408,308 | 10/1983 | Smith et al. | 307/117 X |
| 4,450,545 | 5/1984 | Kishi et al. | 307/117 X |
| 4,476,554 | 10/1984 | Smith et al. | 307/117 X |
| 4,528,559 | 7/1985 | Freeman | 307/117 X |
| 4,586,031 | 4/1986 | Grinneiser | 340/566 |
| 4,630,248 | 12/1986 | Scott | 307/117 X |

Primary Examiner—William M. Shoop, Jr.
Assistant Examiner—Paul Ip

[57] ABSTRACT

Infrasonic switch device to actuate an alarm in response to detection of infrasonic energy, including a multi-position switch circuit having a "standby" or "reset" position responsive to infrasonic signals, an infrasonic detection circuit to detect and pass selected levels of infrasonic energy, a trigger circuit to actuate an alarm such as a light or a buzzer for a predetermined time upon detection of the selected levels of infrasonic energy, and a timing circuit to permit actuation of the alarm for a predetermined time when the multi-position switch is in the "standby" or "reset" mode. The device also includes delay switching angle circuitry to consume the power to operate the device's internal components utilizing only selected portions of both the positive and negative AC power cycle and to utilize the balance of each AC cycle to operate the alarm.

10 Claims, 1 Drawing Sheet

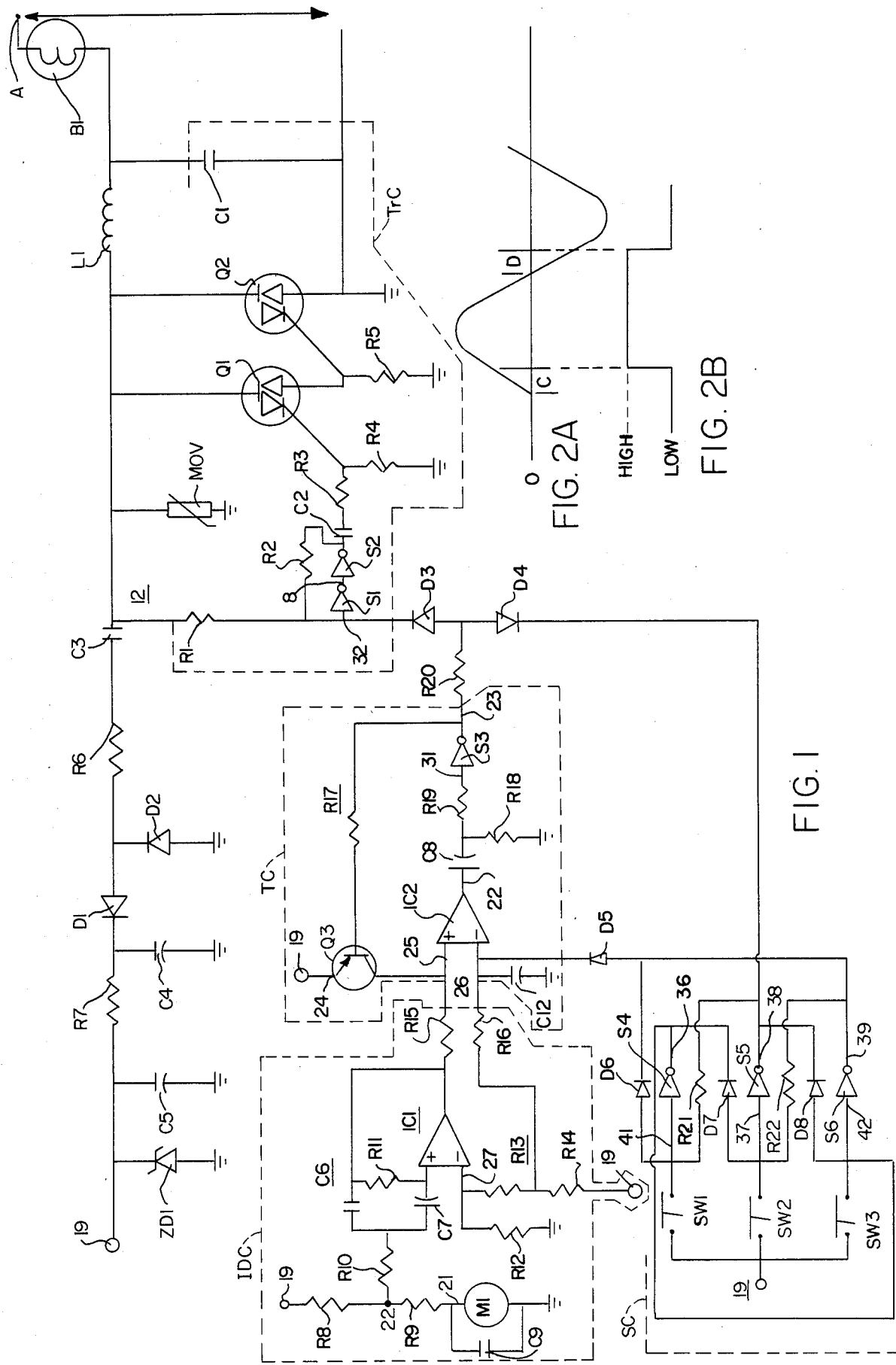

INFRASONIC SWITCH

BACKGROUND OF THE INVENTION

Devices to actuate alarms such as lights are well known in the art but generally alarm systems relate to means for actuating warning lights or audible alarm systems upon the occurrence of a detected intrusion. The difficulty with the use of prior art devices such as alarms, for example lights is that they are generally actuated in response to stimuli which are not intended for actuation of the devices for example, barking dogs or ringing telephone bells.

Other systems include infra-red detectors for use as intrusion detectors but such systems alone do not detect the characteristics surrounding intrusion such as breaking glass or the infrasonic pressure wave generated by an opening door.

While it is known to utilize infrasonic detectors for example as shown in U.S. Pat. Nos. 3,914,755, 3,573,817, 3,940,069 and 4,134,109 no prior art arrangements are known to utilize infrasonic detectors to actuate lights, or other devices for selected time periods either to signal unauthorized intrusion or to allow time for the light to be on by entry to provide light to, for example, reach a light switch.

SUMMARY OF THE INVENTION

The present invention provides a new and useful device which serves as an alarm and provides a utilitarian function in that it can be used to turn on an alarm, for example a light in the event of entry into a dark area such as a room. Also, devices within the scope of the present invention can have override arrangements so that if it is not desired for the light to be turned on in response to entry into the area the infrasonic detection system can be overridden.

Briefly, the present invention provides a lighting arrangement where an infrasonic detector means is provided in a normal light switch utilized to turn on a ceiling light or actuate a circuit which turns on a light. Devices within the scope of the present invention are economical to fabricate and advantageously so small in size that they can be utilized in the normal light switch box.

Additionally, devices within the scope of the present invention can also be utilized to provide an alarm when unwanted entry is achieved which is signaled by the turning on of a light or other means.

Specifically, devices within the scope of the present invention permit actuation of light upon entry into an enclosure having two entries but a light switch beside only one the same as would be available in the event there were a light switch by each entry.

Further, in one embodiment in accordance with the present invention an alternating current (AC) power supply is used and the "O" crossing is used in the function of the device.

Accordingly, the utility of the present invention can be seen and the novelty of the invention lies in the circuitry and in the overall concept.

Briefly, the present invention provides a multi-position switching arrangement, responsive in one mode or position to receipt of detected infrasonic energy indicating an intrusion into a detected area, such as the pressure wave generated by the opening of a door into an enclosed area.

A key feature of the present invention is the providing of a multi-position switch circuit [SC], infrasonic detection circuit [IDC], timing circuit [TC] and trigger circuit [TrC] which are uniquely combined, so that when SC is in the infrasonic or reset mode, the detection of infrasonic energy by IDC will trigger TrC to activate an alarm [B1] for a time determined by timing circuit TC. Because trigger circuit TrC operates on the delay switching angle discussed above and hereinafter, there is sufficient power remaining from the AC power line to operate the internal circuits of the device itself.

One practical application of the present invention is to use it to turn on selected lights in a dark house when the device detects infrasonic energy generated, for example, by the opening of a door. In this way, the alarm (turning on the lights) is most useful as a "friendly" alarm, to turn on selected lights upon returning home. After entry into the now-lighted area, the operator can place the multiposition switch in either the "on" or "off" position, as desired. Of course, the device could also be wired to a "hostile" alarm, such as a buzzer or a trouble relay to signal police, or other security responses.

While various arrangements within the scope of the present invention will occur to those skilled in the act upon reading the disclosure set forth hereinafter, the disclosure, including the drawings, set forth hereinafter illustrates one arrangement within the scope of the present invention.

BRIEF DESCRIPTION OF THE DRAWINGS

The drawings illustrate one arrangement within the scope of the present invention wherein:

FIG. 1 is a schematic diagram of an arrangement within the scope of the present invention; and FIGS. 2A and 2B illustrate wave forms utilized within the delay switching angle circuitry of the present invention.

DETAIL DESCRIPTION OF THE DRAWINGS

An example of one circuit within the scope of the present invention is described hereinafter and consists of a multi-position switching circuit SC, an infrasonic detection circuit IDC to provide an intrusion signal in response to selected levels of infrasonic energy, a timing circuit TC activated by receipt of the intrusion signal, and a trigger circuit TrC to actuate an alarm (such as a light or a buzzer B1) either on a timed basis in response to receipt of the intrusion signal when the multi-position switch is in the infrasonic (or ready or reset) mode, or constantly when the multi-position switch is in the "on" position or mode.

One of the key advances of the present invention is the utilization of Schmitt trigger devices S1 and S2, the input of which is preceded by voltage divider resistors R1 and R2, so the trigger switches are activated by the constantly changing polarity of delay switching angle of the AC power signal sine wave form, as described in more detail below. In FIG. 1 the trigger circuit TrC includes a low power supply triac Q1 to power the alarm means B1 (shown as a light) from AC power supply arrangement shown a light B1 is provided in AC power supply A-B. While there is a single integrated circuit available for the described purposes, the disclosed dual triac assembly is advantageously utilized in the present invention and is gated at or slightly past "0" crossing (See, discussion relative to FIG. 2, infra). A radio frequency suppressor choke L1 and radio frequency suppression capacitor C1 are provided as an "L" filter. Triac Q2 is the main power switch for the trigger circuit and is controlled by triac Q1.

The gate of triac Q2 is controlled in turn by a circuit that generates a trigger pulse of the required polarity each time the circuit changes state in response to change in state at input 32 to Schmitt Trigger S1. The signal changes at input 32 occurs as the AC wave form goes through the "0" crossing as shown in FIG. 2A, and builds up in voltage across resistor R1. At the same time the voltage at input 32 also goes up at a rate determined by the values of resistors R1, and R2 which comprise a voltage divider. For example, when output 8 of Schmitt Trigger S2 is low and voltage is going up on a positive half cycle the resistors R1, and R2 divide the rising voltage so the voltage at input 32 of Schmitt Trigger S1 eventually reaches the upper threshold to trigger the change of state of Schmitt Trigger S1 output 8. Accordingly, for example on the positive accession of the main AC wave form R1 and, R2 divide down the voltage to a level acceptable by the Schmitt trigger S1, for example, say at the 30 volt value as shown in FIG. 2. In FIG. 2A, at a selected phase angle C into the AC sine wave beyond the "0" crossing the transistion at output 8 takes place as shown in FIG. 2B from the low state, that it was in, to a high state. This low to high transistion is differentiated by capacitor C2 causing positive polarity at the gate of triac Q2 to trigger triac Q1 to the conductive state, which then drives the gate of triac Q2 driving it on, as well to turn on alarm B1. Triac Q1 is used to provide a low power driving configuration to allow use of CMOS Schmitt Triggers which do not require too much power so that interface triac Q1 is used.

Likewise, on the negative half cycle of the AC wave, output 8 is high and opposite polarity is applied to input 32 so the equivalent situation takes place where resistors R1 and R2 are again dividers. When the signal goes negative enough, it reaches the lower threshold an input 32 to Schmitt Trigger 1 and after lapse of a certain amount of time, and at a selected signal interval beyond "0" crossing for example angle D the circuit again changes state. It will be recognized that in this regard the circuit reacts much like a flip-flop. That is, output 8 makes a high to low transition as the polarity of the AC signal is reversed, since the triac is bidirectional. Trigger circuit TrC triggers immediately since a negative pulse supplied to the gate triggers triac Q1 which remains on for the next half cycle. A trigger delay is introduced by the time required for the transition of the Schmitt Trigger while the voltage wave form climbs a certain amount so that the power supply circuurity described hereinafter remains charged sufficiently to keep the circuit operating and also power the alarm B1 from the remaining portion of each AC sine wave cycle.

The alternating current signal is also applied to a power supply circuit at point where the power supply 12 consists of limiting resistor R6 with a clamping diode D2, rectifier diode D1 filter capacitor C4, limiting resistor R7, decoupling capacitor C5 and regulator zener diode ZD1 providing for example 5.6 volts DC at the cathode of diode ZD1 to operate CMOS components 54, 55 and 56 of SC, the detector circuit described hereinafter. As described more fully below, when the system is in the quiescent state, that is the multi-position switch circuit is in the infrasonic mode or reset state, triac Q2 is not triggered so no switching is taking place therefore there is no sudden return to near "0" of the voltage wave form coming in. When triac switch QI is on, the full AC wave form is applied to the circuit and capacitor C3 acts as a divider to adjust the voltage substantially to reduce the likelihood of excessive voltage on capacitor C4, which acts as is a filter to smooth out the ripple that otherwise would occur at the anode of diode D1. Capacitor C4 also allows sufficient charge to accumulate during the short period of time between "0" crossing and triac triggering to allow accumulation of a sufficient reservoir of charge (and therefore voltage level) to supply power to the infrasonic detector circuit multi-position switch circuit and timing circuit described hereinafter.

Referring again to FIG. 1, the infrasonic detection circuit IDC of the present invention includes an infrasonic energy detector, in this example electret microphone M1, to provide an output 21 when infrasonic energy is produced during intrusion into an enclosed area equipped with a switch of the present invention. Output 21 of microphone M1 is fed to a high frequency decoupling capicator C9 connected directly across the microphone to attenuate high frequency signals. Microphone M1 is provided with current via resistors R8 and R9 from power supply 19. The junction 22 between resistors R8 and R9 provides a takeoff point for the intrusion (microphone) signal which is supplied through resistor R10 to an amplifier filter circuit consisting of op amp IC1, and resistor R11, as well as capacitors C6 and C7. The configuration functions as a band pass filter amplifier which passes frequencies in the order of one to two Hertz. This low frequency has been found to be particularly useful in the detection of entry into an area because it has been found that simply opening a door, or even the slightest displacement and rebound of a wall panel or pane of glass results in a low pressure, low frequency wave form which is particularly indicative of entry and can be detected by an audio microphone. The unique feature of the present invention is the operation of the device while the multiposition switch circuit SC is in the infrasonic or reset mode, SW3. In the SW3 mode, the comparator with a comparator input IC2 acts as the input of timing circuit TC and is biased by signal 39 from SW3 of SC which is always slightly higher than input 25, the output from band pass filter IC1 of infrasonic detection circuit IDC. Because of this bias, output 22 of IC2 is normally "low" and signal 23 is normally "high". At input 32 of Schmitt Trigger S1 of delay switching angle trigger circuit TrC, signal 23 overrides signal 12 from the power source, so that the charge on C2 remains constant, so in turn triac driver Q1 is not actuated and thereby triac driver Q2 remains off.

Upon receipt of an infrasonic signal from IDC, the value of 25 now overrides signal 26 to cause 22 to go "high" to charge C8 which causes the output of S3 to go "low". The output of S3 is fed back through R17 to PNP transistor Q3. Collector 24 of Q3 is powered by rectified power source 19, but Q3 cannot turn "on" unless and until it receives signal 23 through R17. When Q3 turns "on" (when receiving signal 23 after 22 goes "high"), the output of Q3 is fed back to be an input 25 of IC2. It is seen that output 22 of IC2 will stay "high" until C8 is discharged through R18.

During the time C8 remains charged above a threshold level of S3's input, signal 23 stays "low", which causes diode D3 to go "open" which in turn reduces or removes the override of signal 12 at input 32 of Schmitt Triggers S1 and S2 of delay switching angle trigger circuit TrC. When signal 12 is received by triggers S1 and S2, capacitor C2 converts to "charge varying" state to permit current flow to the gate of triac Q1 to turn on Q1 which then is powered to turn on triac Q2 to actuate alarm B1. It is seen that Q1 and Q2 will be powered by signal 12 for so long a time as signal 12 is not overridden at point 32, which is determined by the length of time it will take to discharge C8 of timing circuit TC; this time, of course, is determined by the RC time constant set by selected values of C8 and R18.

As discussed above, because of the voltage divider circuit provided by R1 and R2, the Schmitt Triggers S1 and S2 of trigger circuit TrC are actuated on a delay switching angle of the AC power wave passing through either side of "0", so that the power consumed during the delay switching angle (C and D of FIG. 2A) of each power cycle is used to operate the infrasonic detection circuit IDC and the timing circuit TC and the trigger circuit TrC (when the device detects an infrasonic signal of the selected frequency), and the balance of each power cycle is used to operate the alarm B1.

When the multi-position switch circuit is in the "on" mode (SW2), signal 39 is provided which drives output 22 of IC2 to go constantly "low" which disables the timing circuit TC. When TC is disabled, 22 stays "low" and 23 stays constantly "high". When 39 goes "high" 38 goes "low" causing diode D4 to conduct in its forward bias direction, which removes the override of signal 12 at input 32 into the trigger circuit TrC. In this mode, it is seen, B1 is constantly powered.

In operation, when an infrasonic wave is detected by microphone M1, the resulting signal is applied to the filter amplifier including op amp section IC1 and the signal is amplified, if it is within the range of frequencies passed by the filter, previously described. The amplifier IC1 provides an intrusion signal excursion 24 to the noninverting input 25 of the second op-amp stage IC2 which in this case is connected as a comparator. The inverting input 26 of op amp IC2 input is connected through a voltage divider including a resistors R13, R14 to set a reference that is slightly off set from the quiescent DC operating voltage of the output 24 of filter amplifier IC1. The quiescent DC operating point from op amp IC1 is also established by the voltage divider comprised of resistors R12, R13, R14 connected as shown to the noninverting input 27 of op amp IC1. However input 27 is connected to slightly more negative point in the divider than input 26 of the comparator IC2 whereby the voltage level at input 26 is off set slightly more positive than the quiescent DC operating point of the amplifier filter input 27. Therefore in the event the intrusion signal 25 goes beyond this slightly more positive reference input, the output 22 of op amp IC2 will make a logic transition to high. The negative end of capacitor C8 will also thereby go high at the same time thereby creating a logic high at input 31 of the Schmitt Trigger S3 resulting in a low logic signal at output 23 which turns on transistor Q3 which is a PNP transistor. Transistor Q3 conducts thereby providing a feedback high at input 25 to op amp IC2 such if the low frequency signals received by microphone M1 should then thereafter diminish the circuit remains activated until the negative end of capacitor C8 has dropped in voltage below the lower threshold of the Schmitt Trigger S3 at which time the output of Schmitt trigger S3 returns to the high logic state to return the device to the reset state and turn off alarm B1.

A low during the activation period means that diode D3 is nonconductive allowing excursions to take place at the input 32 of the Schmitt trigger S1. In the normal quiescent reset state input 32 is high so diode D3 is conducting to hold the input high thus preventing any transition from taking place at output 32 of Schmitt Trigger S3 thus preventing a trigger pulse from being applied to the gates of triac Q1 and maintaining alarm B1 in the off state.

Operation of the alarm B1 can also be overriden or placed on standby by the other modes of the multi-position switch circuit SC, which can be called a 3 stage flip flop described hereinafter, where any one of three inputs will cause the flip flop to latch into one of three states. In FIG. 1, inverters S4–S5, for example inverting Schmitt Triggers, and diodes D6–D8 are provided in the configuration shown with the power supply 19 connected to the inverter inputs and the anodes of diodes D6–D8. Switches SW1–SW3 are also provided to switch the system between the off, (SW1), on (SW2), and infrasonic standby (SW3) positions. Assuming a low at output 36, diode D7 is fully biased such that there is a low on input 37 to inverter S5 which means that outputs 38, 39 of inverters S5, S6 have high logic state. The high state on output 38 means a high state on input 41 to inverter S4 which also means diode D8 is nonconductive being reverse biased high on at output 39. A high state output 39 would mean a high state on input 37 except for the fact that output 36 is holding it low via diode D7, therefore diode D2 over rides the output of diode D6 by virtue of the fact that diode D7 has a lower forward conducting impedence resistor R22. Diode D6 being high also implies that diode D6 is reverse biased therefore nothing is happening because there is no current flow through diode D6. But in this particular state a constant high is provided on input 41 via resistor R21 so the input 37 is held low by the output at 36 and the state of input 42 and output 39 are really out of the picture. On change in state of this device where input 37 is now low, a momentary high is applied on the push button SW2 to force a momentary high on input 37 so output 38 goes low which means a low on input 41 via resistor R21. There is no effective path through diode D6 since it is still reverse biased by the high at output 39 but input 41 goes low so output 36 goes high to create a high on input 42 to create a low output 39 and a low on input 41 holding output 36 high. A logic high at input 37 means a logic low at output 38. A low at output 38 is applied to input 41 which creates a high at output 36. However a low at output 38 forces input 42 to be low as well. So diode D8 in this case now that D8 is foreward biased, so input 42 is low, but output 39 is held high to supply a feedback logic high to input 36 through resistor R22 so it laches. Therefore, that effect (low on 4) of a logic low at output 38 is to provide a 3 stage cross coupled cascaded configuration so that operating the input of any one of the three switches S1–S3 its corresponding inverter output to go to logic low which then forces the other two inverters into the opposite.

The switch positions, as previously stated are off, on, infrasonic, so that a high to the appropriate input, applies a positive voltage to one of three inputs. In the example shown momentary push buttons are provided and for example if SW1 is actuated a logic high is on input 41 so output 36 is low and outputs 38 and 39 are both high. A high on output 39 would be applied by way of diode D5 to the inverting input 26 of the comparator of IC2 to override the normal voltage reference being applied to inputs 26, forcing the output to be low and continue to be low regardless of any action or activity on the output of the filter IC1. A high at output 39 means a low at the input of the comparator IC2 resulting in a steady logic low at input 31 to the Schmitt trigger package S3 which means a high at the output applied input 32 to Schmitt Trigger S1.

Upon depression the "on" button provides a constant on state just like a regular switch if input 37 of the Schmitt Trigger S5 is high then which means output 38 is low and forward biases diode D4 providing a low at the junction of resistor R20 and diode D3 therefore the high state at output 23 of Schmitt trigger S3 is overridden by the low from output 38, again though diode D4 so the flip-flop trigger circuit including Schmitt triggers S1 and S2 are allowed to operate once again, and the triacs are triggered and load B1 is on. In the infrasonic mode however, input 42 is high so output 39 goes low, which means a high output 36. The low on output 39 causes the voltage override on diode D5 so IC1 is allowed to operate at its normal reference voltage. The high on input 37 means that diode D4 is out of the circuit because it is reversed biased. Therefore, there is no high override being applied to the junction of resistor R20 and diode D3 and signal 12 from the power source is no longer overridden at input 32 to Schmitt Trigger S1 of Trigger Circuit TrC. Another way to describe the junction between R20 diodes D3 and D4 is that of an "AND" gate, where a low on the cathode of diode D4 creates a low at the anode as "well. That" overrides the high from the Schmitt trigger output 23, thus putting the system (in the infrasonic mode) to permit intrusion signal 25 in response to infrasonic events by means of the monostable vibrator one shot comparator to actuate operate and control for timed periods the trigger circuit TrC.

The invention claimed is:

1. Infrasonic switch apparatus disposed between an alarm signal means and an alternating current power source, comprising;
    infrasonic detection means for providing an intrusion signal in response to selected levels of infrasonic energy;
    timing circuit means connected to said infrasonic detection means for providing a signal output for a predetermined time in response to said intrusion signal;
    delay switching angle trigger switch means connected between said alarm signal means and said power source for receiving said signal output of said timing circuit means for enabling a current flow through said alarm signal means in response to said output of said timing circuit means; and
    multi-position switch means connected to said timing circuit means and having at least one first position for enabling said timing circuit means to either have a continuous signal output or to interrupt the signal output thereof and also having at least one other position for enabling said timing circuit means to provide an output for said predetermined period of time.

2. The invention of claim 1 wherein said power source is an AC power source configured to provide an input signal into said delay switching angle trigger circuit means and is further configured to provide rectified and filtered power to power said infrasonic detection means, said multi-position switch means, and said timing circuit means.

3. The invention of claim 2 wherein said delay switching angle trigger switch means are powered only during selected portions of the positive and negative phase angles of the AC sine wave power cycle of said AC power cycle thereby leaving the balance of each AC power cycle available to operate said alarm means while said positive and said negative phase angle portions of each said AC cycle powers said switch angle delay trigger circuit means, said timing circuit means and said infrasonic detection circuit means.

4. The invention of claim 3 wherein said timing circuit means includes a monostable multivibrator with a comparator input to receive said intrusion signal, wherein said comparator is biasedly connected to the output of said other position of said multi-position switch means to render said comparator normally logic "low" and thereby impress a bias on the input of said delay switching angle trigger means to override said output from said power source inputting into said trigger circuit means, whereby upon receipt of said intrusion signal said bias on said comparator is overcome and said comparator converts to a logic "high" condition thereby reducing said overriding bias on the input of said delay switching angle trigger circuit means to permit said current flow from said power source to flow to and actuate said delay switching angle trigger circuit means and connect said current from said power source to said alarm signal means and activate said alarm signal means.

5. The invention of claim 4 wherein said normally logic low output of said comparator is blocked by capacitor means coupled to resistor means whereby upon receipt of said intrusion signal by said comparator and said conversion of said comparator from said low logic state to said high logic state an output signal is produced by said comparator to be fed into said capacitor means, thereby causing said capacitor means to conduct and feed a PNP transistor and turn said PNP transistor "on" to feed said output of said comparator back to the input of said comparator to override said bias of said input of said comparator to cause the output of said comparator to remain logic high for such time as is required for said capacitor means to be discharged through said resistor means, whereby during the time period of conduction of said capacitor prior to discharge of said capacitor said overriding bias at said input of said delay switching angle trigger circuit means is reduced to permit said delay switching angle trigger means to receive said power signal from said power source and actuate said alarm means.

6. The invention of claim 5 wherein said first position of said multi-position switch means provides a constant output signal connected to the input of said comparator of said timing circuit means of sufficient force to cause said output of said comparator to be constantly logically "high", whereby said overriding bias to said input of said delay switching angle trigger circuit is constantly reduced to permit said delay switching angle trigger means to constantly receive said signal from said power source and constantly provide power to said alarm means.

7. The invention of claim 4 wherein said multi-position switch means includes an output signal to permit said bias on said input of said comparator of said timing circuit means to remain in a state where said output of said comparator is constantly logically "low", whereby said overriding bias on said input of said delay switching angle trigger circuit means constantly blocks said output signal from said power source, thereby leaving said alarm means in a constantly deactivated state, even when said input of said comparator means of said timing circuit means receives said intrusion signal.

8. The invention of claim 7 wherein said delay switching angle of said delay switching angle trigger circuit means is between 0 and 30 degrees of the sine wave of said AC power cycle, on both the positive and negative sides of the "0" crossing of said sine wave of said AC power cycle.

9. The invention of claim 8, wherein said infrasonic signals have a frequency in the range of 1 to 2 hZ.

10. The invention of claim 8, wherein said infrasonic signals have a frequency in the range of 1 Hertz to 10 hZ.

* * * * *